(12) United States Patent
Kim et al.

(10) Patent No.: US 9,595,688 B2
(45) Date of Patent: Mar. 14, 2017

(54) ORGANIC LIGHT EMITTING DIODE AND ORGANIC LIGHT EMITTING DISPLAY DEVICE INCLUDING HALOGEN DIPOLE MATERIAL

(71) Applicant: SAMSUNG DISPLAY CO., LTD., Yongin-si, Gyeonggi-do (KR)

(72) Inventors: Dong Chan Kim, Gunpo-si (KR); Won Jong Kim, Suwon-si (KR); Eung Do Kim, Seoul (KR); Dong Kyu Seo, Hwaseong-si (KR); Sang Hoon Yim, Suwon-si (KR); Won Suk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/921,844

(22) Filed: Oct. 23, 2015

(65) Prior Publication Data

US 2016/0285035 A1    Sep. 29, 2016

(30) Foreign Application Priority Data

Mar. 23, 2015 (KR) .................. 10-2015-0040030

(51) Int. Cl.
*H01L 27/15* (2006.01)
*H01L 31/12* (2006.01)
(Continued)

(52) U.S. Cl.
CPC ...... *H01L 51/5215* (2013.01); *H01L 27/3248* (2013.01); *H01L 27/3276* (2013.01); *H01L 51/0077* (2013.01); *H01L 51/0084* (2013.01); *H01L 51/0089* (2013.01); *H01L 51/5012* (2013.01); *H01L 51/5056* (2013.01); (Continued)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044
See application file for complete search history.

(56) References Cited

U.S. PATENT DOCUMENTS 5,677,572 A    10/1997 Hung et al.
2013/0001532 A1*  1/2013 Hwang ............... H01L 51/0058
                                                          257/40

FOREIGN PATENT DOCUMENTS

JP    2008-007785 A    1/2008
KR   10-2011-0057008 A  5/2011
(Continued)

*Primary Examiner* — Hoai V Pham
(74) *Attorney, Agent, or Firm* — Lewis Roca Rothgerber Christie LLP

(57) ABSTRACT

An organic light emitting diode includes: a first electrode; a second electrode, the first electrode and the second electrode facing each other; an emission layer provided between the first electrode and the second electrode; and an electron injection layer provided between the second electrode and the emission layer, wherein at least one of the first electrode and the second electrode includes: a first material that is one of a group-1 metal based halogen dipole material, a group-2 metal based halogen dipole material, a lanthanide metal based halogen dipole material, or a transition, metal based halogen dipole material; and a second material that is a metal reacting to the first material.

16 Claims, 5 Drawing Sheets

(51) Int. Cl.
  *H01L 33/00* (2010.01)
  *H01L 51/52* (2006.01)
  *H01L 51/50* (2006.01)
  *H01L 51/00* (2006.01)
  *H01L 27/32* (2006.01)

(52) U.S. Cl.
  CPC ...... *H01L 51/5072* (2013.01); *H01L 51/5092* (2013.01); *H01L 51/5234* (2013.01); *H01L 2251/558* (2013.01)

(56) References Cited

FOREIGN PATENT DOCUMENTS

| KR | 10-1182447 B1 | 9/2012 |
| KR | 10-2014-0117546 A | 10/2014 |

\* cited by examiner

ORGANIC LIGHT EMITTING DIODE AND ORGANIC LIGHT EMITTING DISPLAY DEVICE INCLUDING HALOGEN DIPOLE MATERIAL

CROSS-REFERENCE TO RELATED APPLICATION

This application claims priority to and the benefit of Korean Patent Application No. 10-2015-0040030 filed in the Korean Intellectual Property Office on Mar. 23, 2015, the entire contents of which are incorporated herein by reference.

BACKGROUND

1. Field

Embodiments of the present invention relate to an organic light emitting diode and an organic light emitting device including the same.

2. Description of the Related Art

The recent trend toward lightweight and thin personal computers and television sets corresponds to a trend toward lightweight and thin display devices, and flat panel displays satisfying such requirements are being substituted for conventional cathode ray tubes (CRTs). However, since an LCD is a passive display device, an additional backlight light source is needed, and LCDs have various problems, such as a slow response time and a narrow viewing angle.

In this regard, an organic light emitting diode (OLED) display has recently been highlighted as a display device with characteristics such as a wide viewing angle, high contrast, and fast response speed.

The organic light emitting device includes organic light emitting diodes for emitting light, and in the organic light emitting diodes, electrons injected from one electrode and holes injected from another electrode are combined with each other in an emission layer, thereby generating excitons, and energy is outputted from the excitons to emit light.

However, the conventional organic light emitting diode device requires a relatively high driving voltage, generates low light emission luminance or generates light with low efficiency, and has a short light emission lifespan.

The above information disclosed in this Background section is only to enhance the understanding of the background of the invention, and therefore it may contain information that does not form prior art.

SUMMARY

Embodiments of the present invention may provide an organic light emitting diode with high emission efficiency and a transparent electrode, and an organic light emitting device including the same.

An exemplary embodiment of the present invention provides an organic light emitting diode including: a first electrode; a second electrode, the first electrode and the second electrode facing each other; an emission layer provided between the first electrode and the second electrode; and an electron injection layer provided between the second electrode and the emission layer, wherein at least one of the first electrode and the second electrode includes: a first material that is one of a group-1 metal based halogen dipole material, a group-2 metal based halogen dipole material, a lanthanide metal based halogen dipole material, or a transition metal based halogen dipole material; and a second material that is a metal reacting to the first material.

The electron injection layer may include at least one of a group-1 metal, group-2 metal, lanthanide metal, the group-1 metal based halogen dipole material, the group-2 metal based halogen dipole material and the lanthanide metal based halogen dipole material.

The first material may be a binary inorganic dipole material, a ternary inorganic dipole material, or a quaternary inorganic dipole material.

The electron injection layer includes a plurality of layers, and the respective layers include at least one of the group-1 metal, the group-2 metal, the lanthanide metal, the group-1 metal based halogen dipole material, the group-2 metal based halogen dipole material, and the lanthanide metal based halogen dipole material.

The first material and the second material may form a single layer.

The first electrode and the second electrode may each include a plurality of layers, and the respective layers may include one of the first material and the second material.

The second material may be thicker than the first material.

The organic light emitting diode may further include an electron transport layer provided between the emission layer and the electron injection layer and a hole transport layer provided between the emission layer and the first electrode, wherein the hole transport layer and the electron transport layer include an organic material.

Another embodiment of the present invention provides an organic light emitting device including: a substrate; a gate line provided on the substrate; a data line; a driving voltage line, the data line and the driving voltage line crossing the gate line; a switching thin film transistor connected to the gate line and the data line; a driving thin film transistor connected to the switching thin film transistor and the driving voltage line; and an organic light emitting diode connected to the driving thin film transistor, wherein the organic light emitting diode includes: a first electrode; a second electrode, the first electrode and the second electrode facing each other; an emission layer provided between the first electrode and the second electrode; and an electron injection layer provided between the second electrode and the emission layer, wherein at least one of the first electrode and the second electrode includes: a first material that is one of a group-1 metal based halogen dipole material, a group-2 metal based halogen dipole material, a lanthanide metal based halogen dipole material, or a transition metal based halogen dipole material; and a second material that is a metal reacting to the first material.

The electron injection layer may include at least one of a group-1 metal, a group-2 metal, a lanthanide metal, the group-1 metal based halogen dipole material, the group-2 metal based halogen dipole material, and the lanthanide metal based halogen dipole material.

The first material may be a binary inorganic dipole material, a ternary inorganic dipole material, or a quaternary inorganic dipole material.

The electron injection layer may be include a plurality of layers, and the respective layers may include at least one of the group-1 metal, the group-2 metal, the lanthanide metal, the group-1 metal based halogen dipole material, the group-2 metal based halogen dipole material and the lanthanide metal based halogen dipole material.

The first material and the second material may form a single layer.

The first electrode and the second electrode may include a plurality of layers, and the respective layers may include one of the first material and the second material.

The second material may be thicker than the first material.

The organic light emitting device may further include: an electron transport layer provided between the emission layer and the electron injection layer; and a hole transport layer provided between the emission layer and the first electrode, wherein the hole transport layer and the electron transport layer include an organic material.

According to the exemplary embodiments of the present invention, provided are an organic light emitting diode having a transparent electrode formed by reacting a low work function or transition metal based halogen dipole, and a metal reacting to the same, along with an organic light emitting device including the same.

According to the exemplary embodiments of the present invention, light emission efficiency may be increased by having the electron injection layer including a metal-based halogen dipole having a low work function.

DETAILED DESCRIPTION

Figure 1:
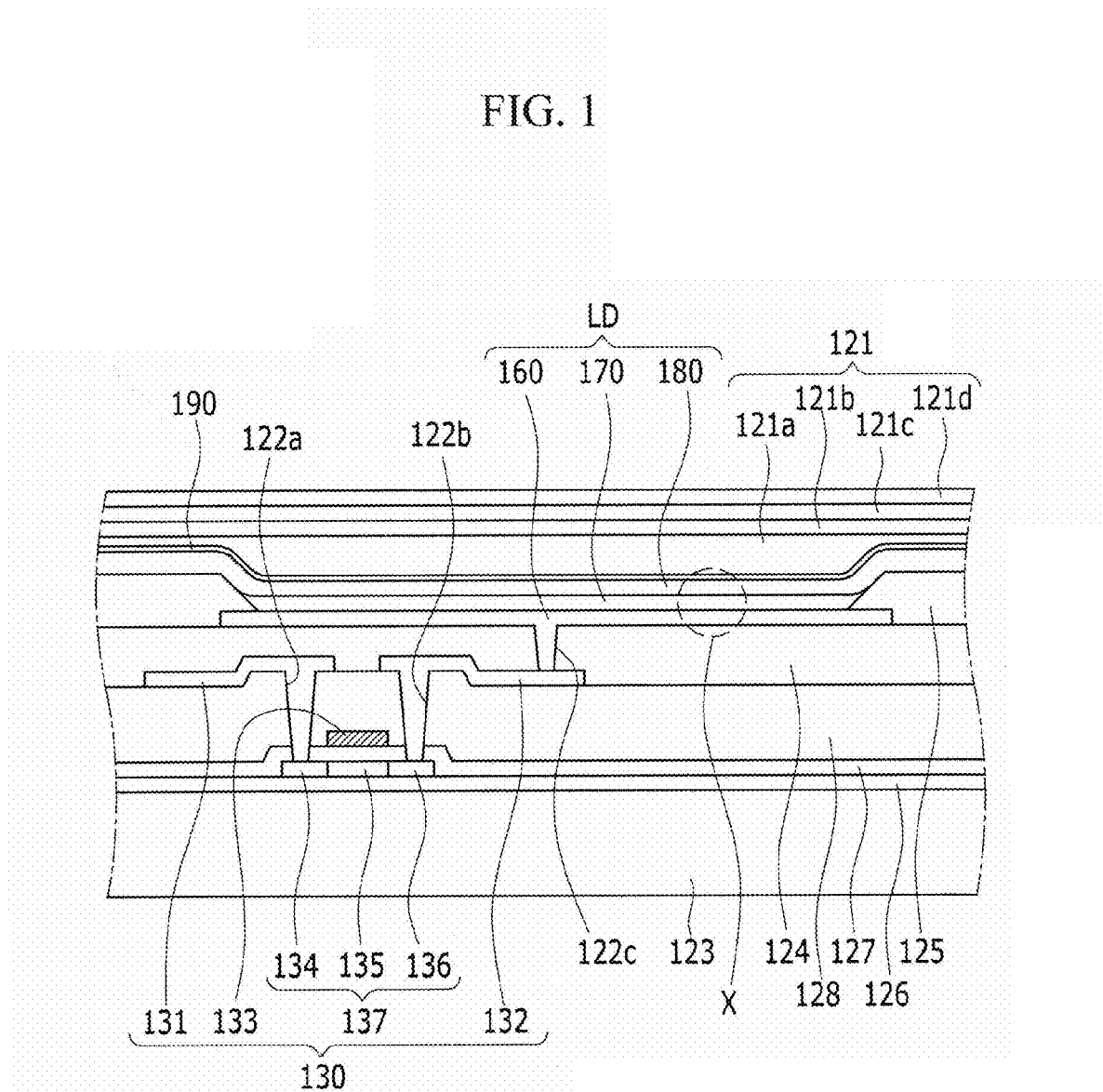
FIG. 1 shows a cross-sectional view of an organic light emitting device according to an exemplary embodiment of the present invention.

Embodiments of the present invention will be described more fully hereinafter with reference to the accompanying drawings, in which exemplary embodiments of the present invention are shown. As those skilled in the art would realize, the described embodiments may be modified in various different suitable ways, all without departing from the spirit or scope of the present invention.

In the drawings, the thickness of layers, films, panels, regions, etc., are exaggerated for clarity. Like reference numerals designate like elements (or components) throughout the specification. It will be understood that when an element such as a layer, film, region, or substrate is referred to as being "on" another element, it can be directly on the other element or intervening elements (or components) may also be present. When an element is referred to as being "directly on" another element, there are no intervening elements (or components) present.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of" or "one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Figure 2:
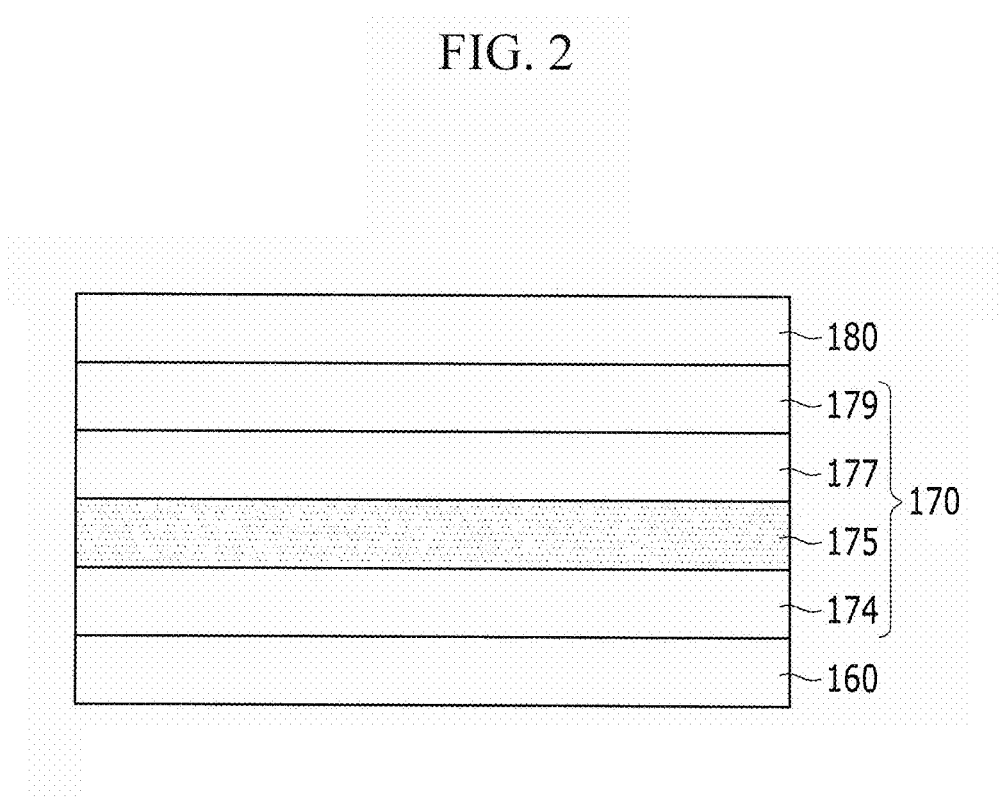
FIG. 2 shows an elarged cross-sectional view of the organic light emitting diode of FIG. 1.

FIG. 1 shows a cross-sectional view of an organic light emitting device according to an exemplary embodiment of the present invention. FIG. 2 shows an elarged cross-sectional view of the organic light emitting diode of FIG. 1.

An organic light-emitting device according to an exemplary embodiment of the present invention will now be described in detail with reference to FIG. 1 and FIG. 2.

Referring to FIG. 1 and FIG. 2, the organic light emitting device includes a substrate 123, a thin film transistor 130, a first electrode 160, a light emitting diode layer 170, and a second electrode 180. The first electrode 160 may be an anode, and the second electrode 180 may be a cathode, or, alternatively, the first electrode 160 may be a cathode, and the second electrode 180 may be an anode.

Here, the substrate 123 may include an inorganic material such as glass, or polycarbonate, polymethyl methacrylate, polyethylene terephthalate, polyethylene naphthalate, polyamide, polyether sulfone, polyimide, or a mixture thereof, a silicon wafer, and the like.

A substrate buffer layer 126 may be provided on the substrate 123. The substrate buffer layer 126 prevents or substantially prevents infiltration of impurities, and also planarizes a surface.

The substrate buffer layer 126 may include various suitable materials capable of performing the function described above. For example, the substrate buffer layer 126 may be any one of a silicon nitride (SiNx) film, a silicon oxide (SiOy) film, or a silicon oxynitriding (SiOxNy) film. However, the substrate buffer layer 126 is not a necessary component, and may be provided, or not, in accordance with the type and the process conditions of the substrate 123.

A driving semiconductor layer 137 is formed on the substrate buffer layer 126. The driving semiconductor layer 137 may include a material including polysilicon. The driving semiconductor layer 137 includes a channel region 135 not doped with impurities, as well as a source region 134 and a drain region 136 formed by doping at both sides of the channel region 135. The doped ion materials may be P-type impurities such as boron (B) and B2H6, which are usually used. The impurities depend on the type of the thin film transistor.

A gate insulating layer 127 made of silicon nitride (SiNx) or silicon oxide (SiOy) is provided on the driving semiconductor layer 137. A gate wire including a driving gate electrode 133 is provided on the gate insulating layer 127. The driving gate electrode 133 overlaps at least part of the driving semiconductor layer 137, for example the channel region 135.

An interlayer insulating layer 128 for covering the gate electrode 133 is formed on the gate insulating layer 127. A first contact hole 122a and a second contact hole 122b that respectively expose the source region 134 and the drain region 136 of the driving semiconductor layer 137 are formed in both of the gate insulating layer 127 and the interlayer insulating layer 128. The interlayer insulating layer 128, similar to the gate insulating layer 127, may include silicon nitride (SiNx) or silicon oxide (SiOy).

A data wire including a driving source electrode 131 and a driving drain electrode 132 may be provided on the interlayer insulating layer 128. The driving source electrode 131 and the driving drain electrode 132 are respectively connected to the source region 134 and the drain region 136 of the driving semiconductor layer 137 through the first contact hole 122a and the second contact hole 122b, which are both formed in the interlayer insulating layer 128 and the gate insulating layer 127.

The driving thin film transistor 130 is formed by the driving semiconductor layer 137, the driving gate electrode 133, the driving source electrode 131, and the driving drain electrode 132. The configuration of the driving thin film transistor 130 is not limited to the example described above and may be modified in various suitable ways known in the art to be easily achieved by those skilled in the art.

A planarizing layer 124 for covering the data wire is formed on the interlayer insulating layer 128. The planarizing layer 124 planarizes a surface by removing a step/height differences to increase emission efficiency of an organic light emitting diode to be formed thereon. The planarizing layer 124 includes a third contact hole 122c for exposing part of the drain electrode 132.

The planarizing layer 124 may, for example, include one or more of polyacrylates resin, epoxy resin, phenolic resin, polyamides resin, polyimides resin, unsaturated polyesters resin, poly-phenylenethers resin, poly-phenylenesulfides resin, and benzocyclobutene (BCB).

An exemplary embodiment of the present invention is not limited to the structure described above, and when necessary or desired, any one of the planarizing layer 124 and the interlayer insulating layer 128 may be omitted.

A first electrode 160 of the organic light emitting diode, i.e., a pixel electrode 160, is provided on the planarizing layer 124. That is, the organic light emitting display device includes a plurality of pixel electrodes 160 respectively corresponding to a plurality of pixels. The plurality of pixel electrodes 160 are spaced apart from each other.

The pixel electrode 160 is connected to the drain electrode 132 through the third contact hole 122c of the planarizing layer 124.

A pixel defining layer 125 having an opening that exposes the pixel electrode 160 is positioned on the planarizing layer 124. That is, a plurality of openings, which respectively correspond to the pixels, are respectively formed between the pixel defining layers 125. An organic emission layer 170 may be provided in each of the openings formed by the pixel defining layers 125. Accordingly, pixel regions, where the light emitting diode layer 170 is formed, may be defined by the pixel defining layers 125.

Thus, the pixel electrode 160 corresponds to the opening in the pixel defining layer 125. However, the pixel electrode 160 does not necessarily correspond to only the opening of the pixel defining layer 125, but a portion of the pixel electrode 160 may be located under the pixel defining layer 125 to overlap the pixel defining layer 125.

The pixel defining layer 125 may include polyacryl-based resin, polyimide-based resin, or a silicon-based inorganic material.

The light emitting diode layer 170 is provided on the pixel electrode 160. The structure of the light emitting diode layer 170 will be described in detail below.

The second electrode 180, i.e., a common electrode 180, may be provided on the light emitting diode layer 170. Accordingly, an organic light emitting diode LD, including the pixel electrode 160, the light emitting diode layer 170, and the common electrode 180, is formed.

The pixel electrode 160 and the common electrode 180 may be formed of a transparent conductive material, or may be formed of a transflective or reflective conductive material. The organic light emitting display device may be a top emission type, a bottom emission type, or a double-sided emission type, depending on the materials of the pixel electrode 160 and the common electrode 180.

An overcoat 190 covering and protecting the common electrode 180 may be formed by an organic layer on the common electrode 180.

A thin film encapsulation layer 121 is formed on the overcoat 190, and seals and protects the organic light emitting diode LD and a driving circuit formed on the substrate 123.

The thin film encapsulation layer 121 includes organic encapsulation layers 121a and 121c, and inorganic encapsulation layers 121b and 121d alternately stacked one by one. FIG. 1 exemplarily illustrates the configuration of the thin film encapsulation layer 121 by alternately stacking the two organic encapsulation layers 121a and 121c and the two inorganic encapsulation layers 121b and 121d, but the present invention is not limited thereto.

An organic light emitting diode according to an exemplary embodiment of the present invention will now be described with reference to FIG. 2.

Referring to FIG. 2, the organic light emitting diode (indicated by X in FIG. 1) includes a structure of sequentially stacking a first electrode 160, a hole transport layer 174, an emission layer 175, an electron transport layer 177, an electron injection layer 179, and a second electrode 180.

When the first electrode 160 is an anode, a material selected from materials having a high work function may be selected for easier injection of holes.

The first electrode 160 may be a transparent electrode. In general, when the first electrode 160 is a transparent electrode, the transparent electrode is formed by forming a thin first electrode 160 by using a conductive oxide such as indium tin oxide (ITO), indium zinc oxide (IZO), tin oxide (SnO2), zinc oxide (ZnO), or a combination thereof, or by using a metal such as aluminum, silver, or magnesium.

However, the transparent first electrode 160 includes a first material that is a metal with a low work function or a transition metal based halogen dipole material (i.e., a transition-metal-based halogen dipole material), and a second material that is a metal reacting to the first material. The conductive and transparent first electrode 160 may be formed through an ionization reaction of the first material that is a dipole material, and the second material reacting to the first material.

That is, the first electrode 160, which is a transparent electrode, forms an inorganic ion conductive layer to have transmittance of more than 80% in the visible ray region, and shows an effect of having relatively little absorption of light.

The low work function metal included in the first material may be a metal having a work function that is less than 4.3 eV. In some embodiments, it is a group-1 metal, a group-2 metal, or a lanthanide metal, and it may be a metal such as Li, Na, K, Rb, Cs, Fr, Be, Mg, Ca, Sr, Ba, Ra, La, Yb, Lu, Tm, Ce, Pr, or Nd.

The low work function or transition metal based halogen dipole may be a binary inorganic dipole, a ternary inorganic dipole, or a quaternary inorganic dipole, and, for example, the first material may be $LiAg_4I_5$, $NaAg_4I_5$, $KAg_4I_5$, $RbAg_4I_5$, $CsAg_4I_5$, $LiCu_4I_5$, $NaCu_4I_5$, $KCu_4I_5$, $RbCu_4I_5$, $CsCu_4I_5$, or $RbYbI_3Mg$.

The second material is a metal reacting to the first material, and may be a transition metal, although the second material is not limited thereto.

The first material and the second material included in the first electrode 160 may be formed to be a single layer, or may be formed to be multiple layers including the first material and the second material. For example, the first electrode 160 may be a dual-layered structure formed by stacking RbI and Mg or RbI and Yb, or may be a triple-layered structure formed by sequentially stacking CuI, Ag, and RbI.

When the first electrode 160 is formed to be a structure with at least two layers, it is desirable for the metal that is the second material to be formed to be thicker than the inorganic dipole material that is the first material. When the metal that is the second material is deposited to be thicker than the inorganic dipole material that is the first material, sheet resistance is substantially reduced, and transparency is improved, which will be described with reference to FIG. 4.

Figure 4:
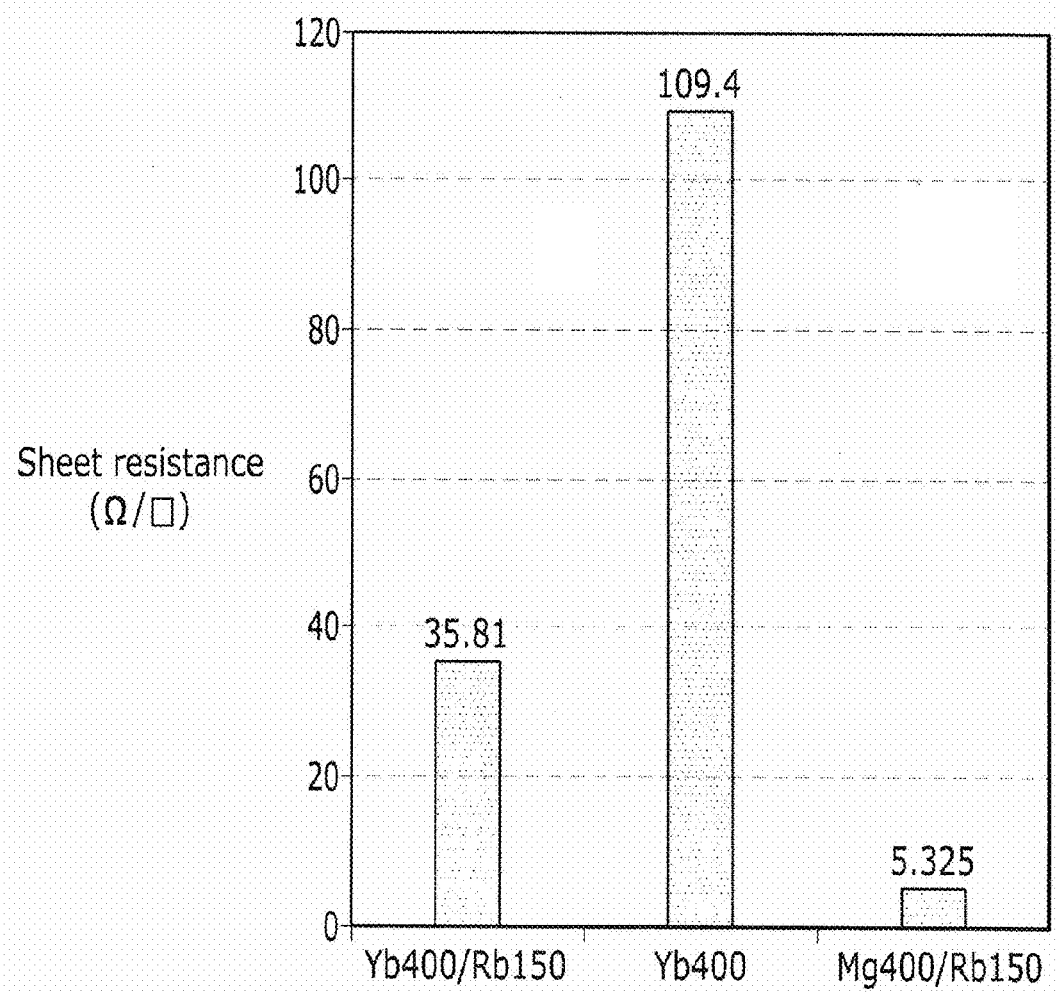
FIG. 4 shows a graph illustrating sheet resistance of an electrode in an organic light emitting diode according to an exemplary embodiment of the present invention.

FIG. 4 shows a graph illustrating sheet resistance of an electrode in an organic light emitting diode according to an exemplary embodiment of the present invention.

In some embodiments, when Yb, which is a low work function metal, and RbI, which is a halogen dipole material, are deposited at a thickness of 40 nm and 5 nm with the first electrode 160 and the second electrode 180, respectively, sheet resistance of 35.81 $\Omega/\square$ is shown, and when Mg, which is a low work function metal, and RbI, which is a halogen dipole material, are deposited at a thickness of 40 nm and 5 nm, respectively, sheet resistance of 5.325 $\Omega/\square$ is shown, thus excellent transparency could be confirmed.

Alternately, sheet resistance when Yb, which is a single metal, is deposited at a thickness of 40 nm with the first electrode 160 and the second electrode 180 shows 109.4 $\Omega/\square$, thus transparency could be confirmed to be more deteriorated than by a reaction of the first material and the second material.

The first electrode 160 may be formed by co-depositing the dipole and the metal according to a sputtering method or a thermal evaporation method.

The hole transport layer 174 is provided on the first electrode 160. The hole transport layer 174 may transport the holes transmitted by the hole injection layer 172.

The hole transport layer 174 may include an organic material. For example, the hole transport layer 174 may include NPD (N,N-dinaphthyl-N,N'-diphenyl benzidine), TPD (N,N'-bis-(3-methylphenyl)-N, N'-bis-(phenyl)-benzidine), s-TAD, and MTDATA (4,4',4"-Tris (N-3-methylphenyl-N-phenyl-amino)-triphenylamine), but is not limited thereto.

The hole transport layer 174 may be about 15 nm to about 25 nm thick (e.g., the hole transport layer 174 may be about 20 nm thick). The hole transfer/hole injection layers may be formed as a single layer by transforming the above-described hole transport layer 174, and by including a hole injecting material in the hole transport layer 174.

The emission layer 175 is provided on the hole transport layer 174. The emission layer 175 includes an emission material for expressing a color. For example, the emission layer 175 may express basic colors such as blue, green, or red, or combinations thereof.

The emission layer 175 may be about 10 nm to about 50 nm thick. The emission layer 175 includes a host and a dopant. The emission layer 175 may include a material for emitting red, green, blue, and/or white light, and may include a phosphorescent or fluorescent material.

When the emission layer 175 emits red light, it may include a phosphorescent material including a host material, which includes CBP (carbazole biphenyl) or mCP (1,3-bis (carbazol-9-yl), and a dopant, which includes any one or more selected from a group of PIQIr(acac) (bis (1-phenylisoquinoline)acetylacetonate iridium), PQIr(acac) (bis (1-phenylquinoline)acetylacetonate iridium), PQIr(tris (1-phenylquinoline)iridium) and PtOEP(octaethylporphyrin platinum), or it may include a fluorescent material including PBD:Eu(DBM)3(Phen) or Perylene, but the present invention is not limited thereto.

When the emission layer 175 emits green light, it may include a phosphorescent material including a host material, which includes CBP or mCP, and a dopant material, which includes, Ir(ppy)3(fac-tris (2-phenylpyridine)iridium), or it may include a fluorescent material including Alq3(tris (8-hydroxyquinolino)aluminum), but the present invention is not limited thereto.

When the emission layer 175 emits blue light, it may include a phosphorescent material including a host material, which includes CBP or mCP, and a dopant material, which includes (4, 6-F2ppy)2Irpic. Alternatively, the emission layer may include a fluorescent material including any one selected from a group of spiro-DPVBi, spiro-6P, distyryl benzene (DSB), distyrylarylene (DSA), PFO-based polymer, and PPV-based polymer, but the present invention is not limited thereto.

The electron transport layer 177 is provided on the emission layer 175. The electron transport layer 177 may transmit the electron to the emission layer 175 from the second electrode 180. The electron transport layer 177 may prevent or substantially prevent the holes injected by the first electrode 160 from moving to the second electrode 180 through the emission layer 175. That is, the electron transport layer 177 functions as a hole blocking layer to improve a rate of bonding of the holes and the electrons in the emission layer 175.

The electron transport layer 177 may include an organic material. For example, the electron transport layer 177 may include any one or more selected from a group of Alq3 (tris (8-hydroxyquinolino) aluminum), PBD, TAZ, spiro-PBD, BAlq and SAlq, but the present invention is not limited thereto.

The electron injection layer 179 is provided on the electron transport layer 177. The electron injection layer 179 functions to improve the injection of electrons to the electron transport layer 177 from the second electrode 180.

The electron injection layer 179 according to the present exemplary embodiment includes a low work function metal, or includes the low work function metal based halogen dipole material (i.e., the low-work-function-metal-based halogen dipole material).

The low work function metal included in the electron injection layer 179 may be a metal with a work function that is less than 4.3 eV. In some embodiments, it is a group-1 metal, a group-2 metal, or a lanthanide metal, and it may be a metal such as Li, Na, K, Rb, Cs, Fr, Be, Mg, Ca, Sr, Ba, Ra, La, Yb, Lu, Tm, Ce, Pr, or Nd.

In addition, the electron injection layer 179 according to the present exemplary embodiment may be a dipole material generated by combining F, CI, Br, or I that is a halogen to the low work function metal.

That is, the electron injection layer according to the present exemplary embodiment includes a material that does not affect the formation of the second electrode 180 that is an inorganic ion transparent conductor, and helps the injection of electrons without an unwanted reaction to the second electrode 180.

The low work function metal included in the electron injection layer 179, and the low work function metal based halogen dipole material, may be co-deposited to form a single layer or to form double layers including the low work function metal and the low work function metal based halogen material.

The electron injection layer 179 may be formed according to a sputtering method or a co-deposition method.

The second electrode 180 is provided on the electron injection layer 179. When the second electrode 180 is a cathode, it may include a material with a small work function for easier injection of electrons. In some embodiments, metal such as magnesium, calcium, natrium, kalium, titanium, indium, yttrium, lithium, gadolinium, aluminum, silver, tin, lead, cesium, and barium, and alloys thereof, may be used, and multi-layered structure materials such as LiF/Al, LiO2/Al, LiF/Ca, LiF/Al and BaF2/Ca may be used, but the present invention is not limited thereto.

The second electrode 180 according to the present exemplary embodiment is a transparent electrode similar to the above-mentioned first electrode 160.

The second electrode 180 is similar to the first electrode 160 described with reference to FIG. 2, except that it is provided on the electron injection layer 179 of the second electrode 180 according to the present exemplary embodiment.

Figure 3:
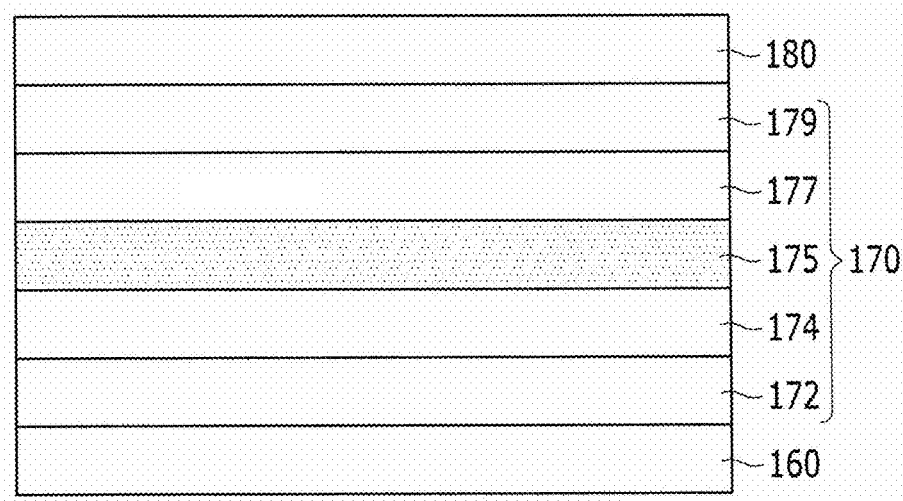
FIG. 3 shows a cross-sectional view of a partly modified organic light emitting diode of FIG. 2 according to exemplary embodiment of the present invention.

FIG. 3 shows a cross-sectional view of a partly modified organic light emitting diode of FIG. 2 according to an exemplary embodiment of the present invention.

Referring to FIG. 3, a hole injection layer 172 is added to the organic light emitting diode LD of the embodiment described with reference to FIG. 2. In the present exemplary embodiment, the hole injection layer 172 is provided between the hole transport layer 174 and the first electrode 160. The hole injection layer 172 helps with the injection of holes into the hole transport layer 174 from the first electrode 160. In the present exemplary embodiment, the hole injection layer 172 may include a metal with a work function that is greater than 4.3 eV, or may include a dipole material that is a combination of a non-metal and halogen. The present invention is not limited thereto and the hole injection layer 172 may include other inorganic materials or other organic materials.

The metal with a work function that is greater than 4.3 eV or the non-metal may be an element selected from a group including Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, and Zn.

The contents described in FIG. 2, as well as the above-described difference, may be applied to an exemplary embodiment of FIG. 3.

Figure 5:
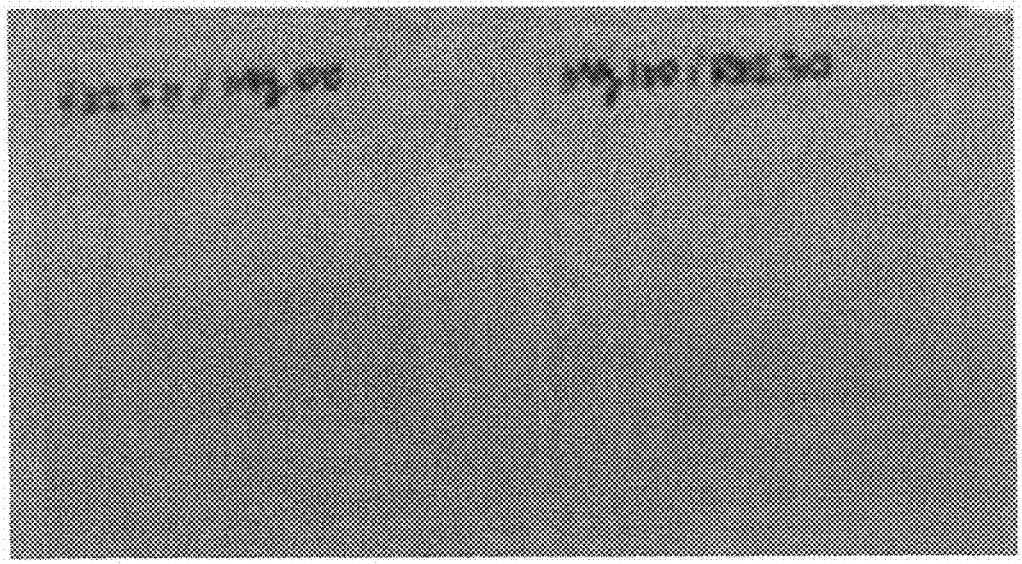
FIG. 5 shows a photograph of a transparent electrode of an organic light emitting diode according to an exemplary embodiment of the present invention.

FIG. 5 shows a photograph of a transparent electrode according to an exemplary embodiment of the present invention. As described above, the transparent electrode is formed through an ionization reaction of the first material, which is a low work function metal or a transition metal based dipole material, and an ionization reaction of the second material, which is a metal reacting to the first material, using the first electrode 160 and the second electrode 180 instead of a transflective metal.

In FIG. 5, the left photograph shows a transparent electrode when Yb, which is a low work function metal, and RbI, which is a halogen dipole material, are deposited at a thickness of 40 nm and 5 nm with the material of the first electrode 160, and the right photograph shows a transparent electrode when Mg, which is a low work function metal, and RbI, which is a halogen dipole material, are deposited at a thickness of 40 nm and 5 nm with the material of the first electrode 160.

Referring to FIG. 4 and FIG. 5, the transparent electrode according to the present exemplary embodiment has low sheet resistance, and thus may have excellent transparency and may be applicable to the organic light emitting device, an optical filter, an electronic interceptor, a solar battery, a liquid crystal display, a touch screen, and a mobile phone electroluminescence (EL) keypad.

While embodiments of the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. An organic light emitting diode comprising:
   a first electrode;
   a second electrode facing the first electrode;
   an emission layer between the first electrode and the second electrode; and
   an electron injection layer between the second electrode and the emission layer,
   wherein at least one of the first electrode and the second electrode comprises:
      a first material comprising one of a group-1 metal based halogen dipole material, a group-2 metal based halogen dipole material, a lanthanide metal based halogen dipole material, or a transition metal based halogen dipole material; and
      a second material comprising a metal reacting to the first material.

2. The organic light emitting diode of claim 1, wherein the electron injection layer comprises at least one of the group-1 metal, the group-2 metal, the lanthanide metal the group-1 metal based halogen dipole material, the group-2 metal based halogen dipole material, and the lanthanide metal based halogen dipole material.

3. The organic light emitting diode of claim 2, wherein the first material is a binary inorganic dipole material, a ternary inorganic dipole material, or a quaternary inorganic dipole material.

4. The organic light emitting diode of claim 2, wherein the electron injection layer comprises a plurality of layers respectively comprising at least one of the group-1 metal, the group-2 metal the lanthanide metal, the group-1 metal based halogen dipole material, the group-2 metal based halogen dipole material and the lanthanide metal based halogen dipole material.

5. The organic light emitting diode of claim 2, wherein the first material and the second material form a single layer.

6. The organic light emitting diode of claim 2, wherein the first electrode and the second electrode each comprise a plurality of layers respectively comprising one of the first material or the second material.

7. The organic light emitting diode of claim 6, wherein the second material is thicker than the first material.

8. The organic light emitting diode of claim 2, further comprising:
   an electron transport layer between the emission layer and the electron injection layer; and
   a hole transport layer between the emission layer and the first electrode,
   wherein the hole transport layer and the electron transport layer each comprise an organic material.

9. An organic light emitting device comprising:
   a substrate;
   a gate line on the substrate;
   a data line crossing the gate line;
   a driving voltage line crossing the gate line;
   a switching thin film transistor coupled to the gate line and to the data line;
   a driving thin film transistor coupled to the switching thin film transistor and to the driving voltage line; and
   an organic light emitting diode coupled to the driving thin film transistor,
   wherein the organic light emitting diode comprises:
      a first electrode;
      a second electrode facing the first electrode;
      an emission layer between the first electrode and the second electrode; and
      an electron injection layer between the second electrode and the emission layer,
   wherein at least one of the first electrode and the second electrode comprises:
      a first material comprising one of a group-1 metal based halogen dipole material, a group-2 metal based halogen dipole material, a lanthanide metal based halogen dipole material, or a transition metal based halogen dipole material; and
      a second material comprising a metal reacting to the first material.

10. The organic light emitting device of claim 9, wherein the electron injection layer comprises at least one of the group-1 metal, the group-2 metal, the lanthanide metal, the group-1 metal based halogen dipole material, the group-2 metal based halogen dipole material and the lanthanide metal based halogen dipole material.

11. The organic light emitting device of claim 10, wherein the first material is a binary inorganic dipole material, a ternary inorganic dipole material, or a quaternary inorganic dipole material.

12. The organic light emitting device of claim 10, wherein the electron injection layer comprises a plurality of layers respectively comprising at least one of the group-1 metal, the group-2 metal, the lanthanide metal, the group-1 metal based halogen dipole material, the group-2 metal based halogen dipole material and the lanthanide metal based halogen dipole material.

13. The organic light emitting device of claim 10, wherein the first material and the second material form a single layer.

14. The organic light emitting device of claim 10, wherein the first electrode and the second electrode each comprise a plurality of layers respectively comprising one of the first material or the second material.

15. The organic light emitting device of claim 14, wherein the second material is thicker than the first material.

16. The organic light emitting device of claim 9, further comprising:
   an electron transport layer between the emission layer and the electron injection layer; and
   a hole transport layer between the emission layer and the first electrode,
   wherein the hole transport layer and the electron transport layer each comprise an organic material.

* * * * *